United States Patent [19]

Dortu et al.

[11] Patent Number: 4,612,560
[45] Date of Patent: Sep. 16, 1986

[54] FIELD EFFECT TRANSISTOR OPERATING IN THE ENHANCEMENT MODE

[75] Inventors: Jean-Marc Dortu, Paris; Erhard Kohn, Orsay, both of France

[73] Assignee: Thomson-CSF, Paris, France

[21] Appl. No.: 607,503

[22] Filed: May 7, 1984

[30] Foreign Application Priority Data

May 10, 1983 [FR] France .................. 83 07792

[51] Int. Cl.$^4$ .......................... H01L 29/80
[52] U.S. Cl. ........................ 357/22; 357/15; 357/6; 357/61; 357/51; 357/23.15; 357/23.14
[58] Field of Search .............. 357/23.15, 23.12, 23.6, 357/61, 51, 23.14, 6, , 22, 23.5

[56] References Cited

U.S. PATENT DOCUMENTS

| 4,016,643 | 4/1977 | Pucel et al. ............. 357/15 X |
| 4,375,643 | 3/1983 | Yeh et al. ................ 357/15 |
| 4,407,004 | 9/1983 | Yeh ...................... 357/15 X |

FOREIGN PATENT DOCUMENTS 1923279 12/1970 Fed. Rep. of Germany .
0127280 10/1979 Japan .................. 357/15 P

OTHER PUBLICATIONS

Di Mario et al, "Dual Electron Injector Structure", Applied Physics Letters, vol. 37, No. 1, Jul. 1980, pp. 61-64.
Foster et al, "Electrical Characteristics of the Silicon Nitride Gallium Arsenide Interface", Jour. of the Electro Chem. Soc., vol. 117, No. 11, Nov. '70, pp. 1410-1417.
IBM Technical Disclosure Bulletin, vol. 24, No. 5, Oct. 1981, New York, T. L. Andrade et al, "GaAs Lossy Gate Dielectric FET", p. 2452.
IBM Technical Disclosure Bulletin, vol. 24, No. 7A, Dec. 1981 (New York, U.S.), J. Boituzat et al, "Characterization Method of Metalloid Contamination in the Plasma Etching Step of Schottky Barrier Diodes", p. 3485.
Japanese Journal of Applied Physics, vol. 21, No. 2, Feb. 1982, Tokyo, T. Hotta et al. "A New AlGaAs/GaAs Heterojunction FET with Insulated Gate Structure (MISSFET)", pp. L122-L124.

Primary Examiner—Andrew J. James
Assistant Examiner—William Mintel
Attorney, Agent, or Firm—Oblon, Fisher, Spivak, McClelland & Maier

[57] ABSTRACT

The invention relates to a field effect transistor for ultra-high frequencies, whose gate has a metal-insulator structure with a metal leak. This transistor has a substrate, an active layer, a source electrode and a drain electrode. Thus, its gate comprise a first metal coating forming a Schottky junction with the active layer, a dielectric layer having a controlled leak and a second control gate metal coating. The leak in the dielectric is adjusted in such a way that the Schottky interface and the control gate are in electrical balance at high frequencies. The dielectric is a metal-rich, non-stoichiometric oxide or nitride. Application to high-speed integrated circuits on GaAs.

8 Claims, 5 Drawing Figures

FIELD EFFECT TRANSISTOR OPERATING IN THE ENHANCEMENT MODE

BACKGROUND OF THE INVENTION

The present invention relates to a field effect transistor of the enhancement type operating in ultra-high frequencies, in which the control electrode has a metal—insulator—metal structure. The first metal ensures a Schottky contact with the active layer of the transistor, the insulator or dielectric having a controlled dielectric leak and the second metal constituting the control gate to which the bias voltage is applied.

The technology of integrated circuits on high-speed materials, such as GaAs, more particularly, uses as the active elements Schottky gate-type field effect transistors. In such transistors, the gate is constituted by a metallization or metal coating ensuring a Schottky contact with the active layer of the transistor on which it is deposited. These transistors are frequently called MESFET's, i.e. metal semiconductor field effect transistors.

MESFET's can operate in the depletion mode, for which the gate voltage is negative, the space charge zone located beneath the gate modulating the channel between the input electrodes of the transistor, i.e. the source and drain. They can also operate in the limited enhancement mode. There is a depleted area for a zero gate voltage and this area can be reduced by applying a low positive voltage $V_G$ to the gate. This positive voltage is limited by the height of the metal—semiconductor barrier, in energy diagrams, to a value close to $+0.6$ V, beyond which the gate starts to leak significantly.

For logics applications, it is desirable to be able to work in the enhancement mode, particularly if it is possible to pinch-off the channel between the source and drain for a zero gate voltage, i.e. with normally blocked transistors. The construction of normally blocked MESFET's is limited by the value of $+0.6$ V on GaAs as a result of gate leakage.

An apparently possible solution, namely that of MOS transistors on GaAs suffers from serious instability problems due to the interface states between the metal, insulating and semiconductor layers, which charge and discharge. This instability leads to displacements of the capacitance curve as a function of the voltage, the capacitance being formed by the gate metallization, the oxide layer and the semiconductor layer, after biasing and to a reduction in the transconductance when the transistors are operated at low frequencies.

These difficulties are solved by using a capacitively coupled field effect transistor gate, the dielectric of the gate capacitance having a slight controlled leak, which is adequate to make it possible to maintain in electrical balance the two metal coatings constituting the gate of the transistor according to the invention, but sufficiently low to limit the current of the diode formed between the gate and the active layer of the transistor, said limitation making it possible to operate up to $+1.5$ V bias.

SUMMARY OF THE INVENTION

More specifically, the present invention relates to a field effect transistor operating in the enhancement mode which has, supported by a semi-insulating material substrate, at least one active layer and two input electrodes, called the source and drain, wherein the gate control electrode has a capacitive structure comprising a first metal coating deposited on the active layer and forming a Schottky junction therewith, a dielectric layer deposited on the first metal coating, said layer having a controlled electric leak, a second metal coating, deposited on the dielectric layer, forming the control gate, the gate bias voltage being applied to said second metal coating.

BRIEF DESCRIPTION OF THE DRAWINGS

The invention is described in greater detail hereinafter relative to an embodiment of a transistor, as well as one of its possible variants, with reference to the attached drawings, wherein show.

DETAILED DESCRIPTION OF THE INVENTION

Figure 1:
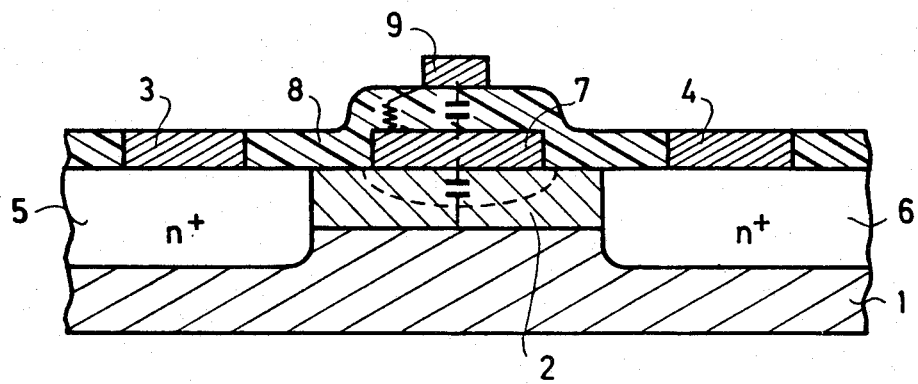
FIG. 1 a sectional diagram of a transistor according to this invention.

A prior art MESFET transistor has a metal gate which is directly deposited on the active layer. MISFET is a prior art transistor whose metal gate is deposited on an insulating layer, itself deposited on the semiconductor material. MIMFET is the transistor according to this invention in which the gate has a metal—insulator—metal structure. These three structures were compared.

Very interesting results have been obtained of late with MESFET's on materials such as GaAs, operating in the enhancement mode. However, MESFET's suffer from a disadvantage of having a relatively limited current capacity in the enhancement mode, while suffering the risk of destruction of the diode formed by the gate and the active layer for positive bias voltages. These difficulties can be overcome by using a capacitively coupled gate, i.e. by using a MISFET, in which an insulating layer separates the gate metallization from the active layer. However, the distribution of the interface states in a MIS transistor or a MOS transistor, which is only a special form of a MIS transistor, does not make it possible to operate these devices in a stable biasing condition if the transistor is produced on GaAs.

Therefore, if the insulator placed between the gate metallization and the semiconductor active layer of the transistor is perfect and has a very high resistivity, the electric charges cannot flow through said insulating layer and there is no stable electric balance, the charges due to the interface states being displaced in an uncontrolled manner.

The gate structure proposed by this invention uses a gate having a first metal which forms the Schottky junction with the active layer of the transistor, then a dielectric layer, i.e. an insulator having an electric leak which is controlled by construction during the production of the transistor, and finally a second metal layer deposited on the dielectric layer, the second metal layer constituting the outer electrode or control gate, to which the bias is applied.

The leak in the insulating layer is chosen in such a way that on the one hand the Schottky metallization, in contact with the semiconductor material, is kept in electrical balance with the control gate or the second upper metallization, up to a positive bias close to flat band conditions and, on the other hand, so that the current in the diode formed by the complex gate and the junction with the active layer of the transistor is limited for higher bias voltages, thus preventing the destruction thereof. The term flat bands is understood to mean the conduction and valence bands in the energy diagrams, the latter no longer having a barrier between the metal and the semiconductor for certain voltage values such as +0.6 V. The term high bias voltage is understood in this context to represent gate bias voltages exceeding 0.6 V, because in prior art transistors, the gate starts to leak for voltages of approximately 0.6 V, i.e. 0.55 to 0.65 V in accordance with the particular construction.

FIG. 1 is a simplified sectional representation of a MIMFET according to this invention. A semi-insulating substrate 1, made from a material from group III–V and more particularly GaAs or InP, supports an active layer 2. The transistor has two input electrodes 3 and 4, one constituting the source and the other the drain of the transistor, said electrodes advantageously being placed on boxes 5 and 6, which define part of the active layer 2 in order to reduce the source—drain series resistance.

The enhancement transistor according to the invention has a control electrode, generally called the gate which, in the present case, has a complex structure formed by a first metal coating 7, forming a Schottky contact with the active layer 2, then an insulating layer 8 having a controlled electric leak, and finally a second metal coating 9 forming the control gate to which the bias voltage is applied.

The first metal coating 7, the insulator having a leak and the second metal coating 8 form a capacitor and as the dielectric 8 (as the insulant 8 is a dielectric material) of said capacitor has an electric leak, the Schottky interface 7 and the control gate 9 are kept in electrical balance. At low frequencies or under static operating conditions, the leak of the dielectric short-circuits the capacitance formed by these two metal coatings and the dielectric. The transconductance and the pinch-off voltage are identical to those of an equivalent prior art MESFET.

Thus, this type of transistor is designed to operate at very high frequencies or under dynamic operating conditions, where the capacitance of the dielectric is in series with the space charge capacitance beneath the gate, which reduces the transconductance and pinch-off voltage of the channel.

FIG. 1 shows the symbolical diagrams of a resistor representing the controlled leak of the dielectric layer 8 and a capacitance representing the capacitance of the capacitor formed by the complex metal—insulator—metal gate. The space charge beneath the Schottky gate and the capacitance of said space charge are shown by dotted lines.

Although the transistor according to the invention has a theoretical dispersion of its characteristics at low or high frequencies, depending on whether the leakage resistance short-circuits one capacitance or two capacitances are in series, it is possible to minimize the dispersion of the transconductance by using as the dielectric material 8 for the gate a material having a high dielectric constant, preferably between 8 and 30.

The preferred materials for producing a MIM gate according to the invention are non-stoichiometric oxides of titanium, tantalum or aluminium, for which the dielectric constants are respectively approximately 30, 26 and 12, but can vary according to the stoichiometry of the oxide. Silicon nitride, doped or not doped by a metal and in accordance with the general formula, which has a dielectric constant between 8 and 10 according to the doping by a metal M, is ideally suited for producing a MIM gate according to the invention. The first metal coating 7 is essentially constituted by a metal forming a Schottky contact with the active layer 2 and e.g. titanium and aluminium are widely used for this purpose.

The second metal coating 9 essentially contacting a power point for supplying a bias to the transistor gate, must readily attach itself to the dielectric layer. For example, it can be formed by a sequence of metallizations, i.e. titanium, platinum, gold, followed by recharging with gold if it is necessary to establish a contact on the control gate 9.

The source and drain electrodes 3 and 4 are e.g. produced in standard manner from Au Ge Ni eutectics, while the production of the active layer 2, boxes 5 and 6 and the metal electrodes 3 and 4 are well known in the art. FIG. 1 shows a MIM field effect transistor according to the invention, produced on materials of type GaAs and the active layer and the boxes are of type n.

Figure 2:
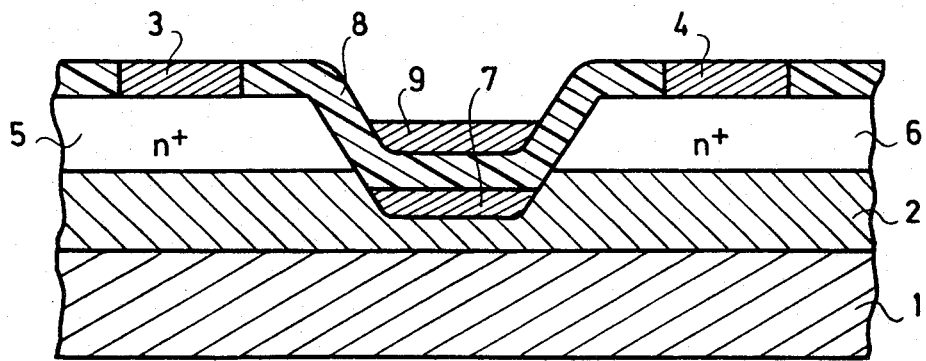
FIG. 2 a sectional diagram of a transistor according to this invention in a constructional variant.

FIG. 2 shows a different embodiment of the transistor according to this invention and the same reference symbols have been used for designating the same elements. FIG. 2 is of interest in that the construction of a buried gate is in direct contact with an active layer 2, which is not defined as in the case of FIG. 1 by the two boxes 5 and 6. FIG. 2 also shows that the dielectric layer interposed between the two metal layers 7 and 9 of the gate can advantageously be extended over the entire free access surface of the transistor and can act as a passivator.

Figure 3:
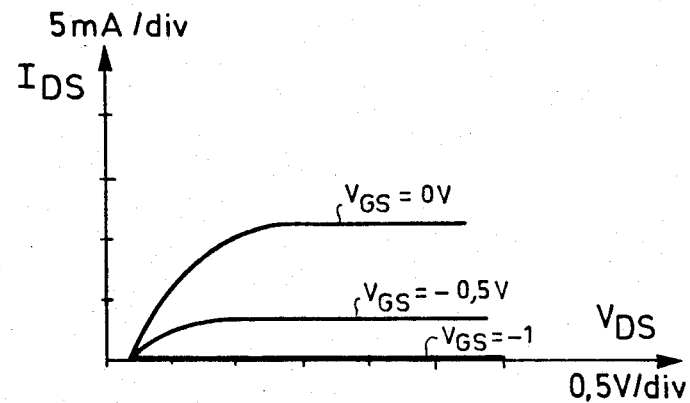
FIG. 3 curves of the I/V characteristics of a prior art MESFET.
Figure 4:
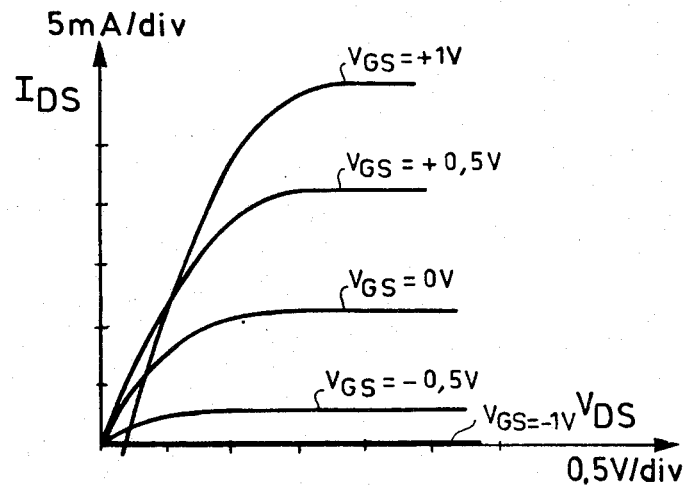
FIG. 4 curves of the I/V characteristics of a prior art MISFET.
Figure 5:
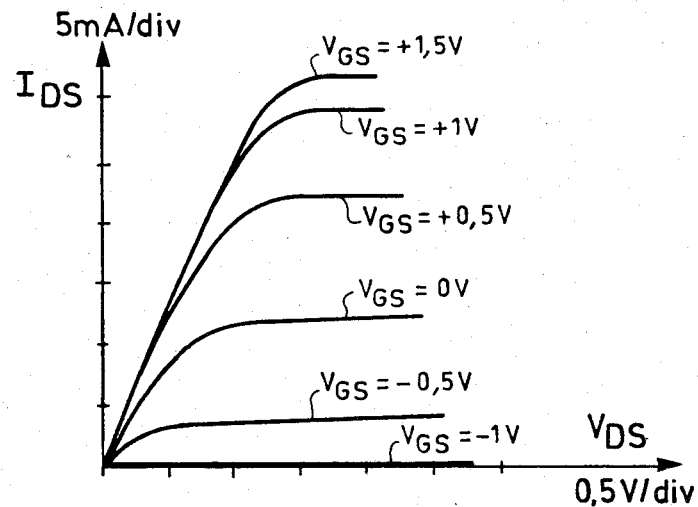
FIG. 5 a curve of the I/V characteristic of a metal-insulator transistor having a leak—metal—semiconductor according to this invention.

FIGS. 3, 4 and 5 make it possible to compare the drain—source current $I_{DS}$ characteristics as a function of the drain—source voltage $V_{DS}$ for different types of transistors according to the prior art and the invention. In all cases, the voltage $V_{DS}$ is plotted on the abscissa, 0.5 V per division, and the current $I_{DS}$ is plotted on the ordinate, 5 mA per division. In each graph, the different curves correspond to different biasing values of the gate, said values being shown on the right-hand part of each graph.

FIG. 3 shows the normal characteristic curve of a MESFET and will constitute reference points for FIGS. 4 and 5.

In FIG. 4, a positive gate voltage is applied to a MESFET according to the prior art. It can be seen that the upper curve, corresponding to a bias $V_G$ of +1 V, has a gate leak, leading to a displacement of the curve, in the vicinity of the origin, the curve of the characteristics for $V_G = +1$ V intersecting the other curves for which $V_G = -1$, $-0.5$ and $+0.5$ V. A more detailed analysis, i.e. when the transistor is supplied with gate voltages in division of e.g. 1/10 V instead of 0.5 V, shows that the gate leakage phenomenon appears at approximately 0.55 V in the case of a MESFET on GaAs.

FIG. 5 shows the same characteristics for a MIM transistor according to the invention. It shows that in the range between $-1$ V and $+0.5$ V, the curves of a transistor according to the invention are exactly identical to those of a prior art MESFET, but that the gate bias voltage can be raised to +1.5 V, i.e. almost three times the limiting value of the prior art transistors, without there being any gate leak.

These particularly interesting results are obtained through a MIM transistor gate structure, which permits the balancing and flow of the electric charges through the dielectric layer having a leak. Moreover, with a +1.5 V gate bias, the diode formed by the gate capacitance and the active layer of the semiconductor is not destroyed, which is frequently the case in prior art transistors. In the case of a MIM transistor according to the invention, the enhancement channel current is approximately 100% higher than that of a conventional MESFET and the transconductance of this device is approximately max. 100mS/mm.

The comparison between FIGS. 3, 4 and 5 is interesting in view of the fact that the characteristics of FIGS. 4 and 3 have been plotted by using a Schottky electrode 7 of a transistor according to the invention, to which the bias voltage has been directly applied. In this case, the dielectric layer 8 and control electrode 9 have no function and the transistor according to this invention, is directly controlled by its Schottky metallization, and behaves in the manner of a prior art MESFET. However, in the case of FIG. 5, the bias has been applied to the control gate 9 according to this invention.

The manufacture of a MIM transistor according to the invention is of a conventional nature. However, in the case of a transistor having a buried gate as in FIG. 2, the depth of the channel is approximately 400Å. The thickness of the insulating layer 8 is approximately 500 Å and if non-stoichiometric, silicon-rich silicon nitride is used for producing this layer, it is deposited by plasma and chemical deposition in the vapour phase, whilst controlling the thickness of approximately 500 Å in such a way as to control the current leak through said dielectric layer and also the possibly doping of the layer by a metal, because it is the supply of metal which controls the leak through the layer.

The MIMFET according to the invention has transconductance characteristics equivalent to those of a MESFET, but its current transfer capacitance in enhancement is increased by approximately 100% compared with that of a conventional MESFET, whilst the leak through the gate is eliminated up to gate biasing values of approximately +1.5 V. This MIMFET is essentially used for producing logic integrated circuits, preferably on high-speed materials of group III-V, such as GaAs, $Al_xGa_{1-x}$, As, InP, In GaAs. However, it is also conceivable to use it on silicon, although the speed of integrated circuits on silicon is less than that of integrated circuits on GaAs.

What is claimed is:

1. A field effect transistor for operating in the enhancement mode comprising;
   a semi-insulating material substrate;
   at least one semiconductor active layer supported by said semi-insulating material substrate, a source electrode and a drain electrode both formed on the active layer and having a gate control electrode which has a capacitive structure comprising;
   a first metal coating deposited on the active layer and forming a Schottky junction therewith,
   a nonstoichiometric dielectric layer deposited on the first metal coating, said layer having a controlled electric leak, a second metal coating, deposited on the dielectric layer, forming the control gate,
   means for supplying a control gate bias voltage to said second metal coating.

2. A field effect transistor according to claim 1, wherein the electric leak across the dielectric layer is such that the electric charges stored at the Schottky interface are in electric balance with the control gate up to a positive bias (+1.5 V) substantially double that for which the conduction and valence bands of the energy diagram of said interface are flat and without barrier height between the metal and the semiconductor active layer.

3. A field effect transistor according to claim 1, wherein the electric leak across the dielectric layer is limited in such a way that the current in the diode formed by the gate and the Schottky junction is limited for high bias voltages.

4. A field effect transistor according to claim 1, wherein the dielectric layer has an electric leak and a dielectric constant $8 \leq \epsilon \leq 30$.

5. A field effect transistor according to claim 4, wherein the dielectric layer has an electric leak at a thickness of approximately 500 Å and is formed from one of the following: $Ti_xO_y$, $Ta_xO_y$, $Al_xO_y$ or $Si_xN_y$, each of these materials being in non-stoichiometric proportions and rich in an element having an x subscript.

6. A field effect transistor according to claim 5, wherein the resistivity of the dielectric layer having an electric leak is controlled by doping with a metal the material forming the dielectric layer.

7. A field effect transistor according to claim 1, wherein the first metalcoating forming the Schottky junction is produced from metals such as Ti and Al and the second metal coating forming the control gate is formed from metals which adhere well to the dielectric layer, such as Ti - Pt - Au.

8. A field effect transistor according to claim 1, wherein the gate bias in enhancement, applied to the second metal coating, is at least double the admissible voltage on the first metal coating, without producing any significant gate leak compared with the channel current.

* * * * *